(12) United States Patent
Sato et al.

(10) Patent No.: US 8,349,401 B2
(45) Date of Patent: Jan. 8, 2013

(54) FILM FORMATION APPARATUS AND METHOD FOR USING SAME

(75) Inventors: Jun Sato, Nirasaki (JP); Kiyotaka Kikuchi, Nirasaki (JP); Hiroki Murakami, Nirasaki (JP); Shigeru Nakajima, Nirasaki (JP); Kazuhide Hasebe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 479 days.

(21) Appl. No.: 12/684,283

(22) Filed: Jan. 8, 2010

(65) Prior Publication Data

US 2010/0189927 A1    Jul. 29, 2010

(30) Foreign Application Priority Data

Jan. 27, 2009  (JP) .................................. 2009-016003

(51) Int. Cl.
*B05D 7/22* (2006.01)
*C23C 16/00* (2006.01)

(52) U.S. Cl. ................... 427/237; 427/255.28; 427/579; 427/588; 118/728; 438/905; 134/1.1

(58) Field of Classification Search .................... None
See application file for complete search history.

(56) References Cited

U.S. PATENT DOCUMENTS

| | | | |
|---|---|---|---|
| 2003/0205237 A1* | 11/2003 | Sakuma | 134/1.1 |
| 2006/0051966 A1* | 3/2006 | Or et al. | 438/706 |
| 2006/0213539 A1* | 9/2006 | Hasebe et al. | 134/22.1 |
| 2009/0000640 A1* | 1/2009 | Aoki et al. | 134/1.3 |

FOREIGN PATENT DOCUMENTS

JP    3-293726    12/1991

* cited by examiner

*Primary Examiner* — Timothy Meeks
*Assistant Examiner* — Michael P Rodriguez
(74) *Attorney, Agent, or Firm* — Oblon, Spivak, McClelland, Maier & Neustadt, L.L.P.

(57) ABSTRACT

A method for using a film formation apparatus includes performing a main cleaning process and a post cleaning process in this order inside a reaction chamber. The main cleaning process is arranged to supply a cleaning gas containing fluorine into the reaction chamber while exhausting gas from inside the reaction chamber, thereby etching a film formation by-product containing silicon. The post cleaning process is arranged to remove a silicon-containing fluoride generated by the main cleaning process and remaining inside the reaction chamber and to alternately repeat, a plurality of times, supplying an oxidizing gas into the reaction chamber to transform the silicon-containing fluoride into an intermediate product by oxidization, and supplying hydrogen fluoride gas into the reaction chamber while exhausting gas from inside the reaction chamber to remove the intermediate product by a reaction between the hydrogen fluoride gas and the intermediate product.

20 Claims, 5 Drawing Sheets

FILM FORMATION APPARATUS AND METHOD FOR USING SAME

BACKGROUND OF THE INVENTION

1. Field of the Invention

The present invention relates to a film formation apparatus for a semiconductor process for forming a thin film containing silicon on a target substrate, such as a semiconductor wafer, and also to a method for using the apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices, a process, such as CVD (Chemical Vapor Deposition), is performed to form a thin film, such as a silicon nitride film or silicon oxide film, on a target substrate, such as a semiconductor wafer. In a film formation process of this kind, a film formation gas is supplied into the reaction tube (reaction chamber) of a heat-processing apparatus, so that the film formation gas causes a reaction and thereby produces a reaction product. The reaction product is deposited on the surface of each semiconductor wafer, and forms a thin film on the surface of the semiconductor wafer.

The reaction product generated during the film formation process is deposited (adhered) not only on the surface of the semiconductor wafer, but also on, e.g., the inner surface of the reaction tube and other members, the latter being as by-product films. If the film formation process is continued while by-product films are present on the inner surface of the reaction tube and so forth, a stress is generated and causes peeling of some of the by-product films and the quartz of the reaction tube and so forth due to a difference in coefficient of thermal expansion between the quartz and by-product films. Consequently, particles are generated, and may decrease the yield of semiconductor devices to be fabricated.

In order to solve this problem, cleaning of the interior of the reaction tube is performed after the film formation process is performed once or repeated several times. Where cleaning is performed for by-product films containing silicon, a halogen-containing acidic gas, such as hydrogen fluoride gas, is supplied as a cleaning gas into the reaction tube. The by-product films deposited on the inner surface of the reaction tube and so forth are thereby dry-etched and removed by the cleaning gas (for example, Jpn. Pat. Appln. KOKAI Publication No. 3-293726).

Where a gas containing fluorine, such as hydrogen fluoride gas, is used as a cleaning gas to remove by-product films containing silicon, various silicon-containing fluorides, such as fluorosilicate, are generated as by-products. Of the silicon-containing fluorides, molecules including six or more fluorine atoms, such as hexafluorosilicate ($H_2SiF_6$) and ammonium fluorosilicate ($(NH_4)_2SiF_6$), can be more easily deposited on the inner surface of the reaction tube. Specifically, in order to vaporize and thereby remove these fluorides, it is necessary to form a vacuum and heated atmosphere of 133 Pa (1 Torr) or less and 100° C. or more. Accordingly, where a gas containing fluorine is used as a cleaning gas to remove by-product films containing silicon, the vacuum and heated atmosphere is formed inside the reaction tube during the cleaning to prevent such fluorides from being deposited, or the vacuum and heated atmosphere is formed inside the reaction tube after the cleaning to remove deposited fluorides.

However, as described later, the present inventors have found that conventional methods including a cleaning process for using a film formation apparatus of this kind have room for improvement in terms of some characteristics of the apparatus concerning the throughput and particle generation.

BRIEF SUMMARY OF THE INVENTION

An object of the present invention is to provide a film formation apparatus for a semiconductor process and a method for using the same, which can improve characteristics of the apparatus concerning the throughput and particle generation.

According to a first aspect of the present invention, there is provided a method for using a film formation apparatus for performing a film formation process to form a thin film containing silicon on a target substrate inside a reaction chamber, the method comprising: performing a main cleaning process and a post cleaning process in this order inside the reaction chamber without the target substrate accommodated therein to remove a film formation by-product containing silicon, generated by the film formation process, and deposited inside the reaction chamber, wherein the main cleaning process is arranged to supply a cleaning gas containing fluorine into the reaction chamber while exhausting gas from inside the reaction chamber, thereby etching the film formation by-product, and the post cleaning process is arranged to remove a silicon-containing fluoride generated by the main cleaning process and remaining inside the reaction chamber and to alternately repeat, a plurality of times, supplying an oxidizing gas into the reaction chamber to transform the silicon-containing fluoride into an intermediate product by oxidization, and supplying hydrogen fluoride gas into the reaction chamber while exhausting gas from inside the reaction chamber to remove the intermediate product by a reaction between the hydrogen fluoride gas and the intermediate product.

According to a second aspect of the present invention, there is provided a method for using a film formation apparatus for performing a film formation process to form a thin film containing silicon, the film formation apparatus comprising a reaction chamber configured to accommodate a plurality of target substrates at intervals in a vertical direction, a support member configured to support the target substrates inside the reaction chamber, an exhaust system configured to exhaust gas from inside the reaction chamber, a gas supply system configured to supply, into the reaction chamber, a silicon source gas, a film formation reaction gas, and a gas for cleaning an interior of the reaction chamber, and a control section configured to control an operation of the apparatus, the method being executed under control of the control section and comprising: performing a film formation process arranged to supply the silicon source gas and the film formation reaction gas into the reaction chamber to form the thin film by CVD on the target substrates accommodated in the reaction chamber; and performing a main cleaning process and a post cleaning process in this order inside the reaction chamber without the target substrates accommodated therein to remove a film formation by-product containing silicon, generated by the film formation process, and deposited inside the reaction chamber, wherein the main cleaning process is arranged to supply a cleaning gas containing fluorine into the reaction chamber while exhausting gas from inside the reaction chamber, thereby etching the film formation by-product, and the post cleaning process is arranged to remove a silicon-containing fluoride generated by the main cleaning process and remaining inside the reaction chamber and to alternately repeat, a plurality of times, supplying an oxidizing gas into the reaction chamber to transform the silicon-containing fluoride into an intermediate product by oxidization, and supplying hydrogen fluoride gas into the reaction chamber while exhausting gas from inside the reaction chamber to remove the intermediate product by a reaction between the hydrogen fluoride gas and the intermediate product.

According to a third aspect of the present invention, there is provided a film formation apparatus for performing a film formation process to form a thin film containing silicon, the apparatus comprising: a reaction chamber configured to accommodate a plurality of target substrates at intervals in a vertical direction; a support member configured to support the target substrates inside the reaction chamber; an exhaust system configured to exhaust gas from inside the reaction chamber; a gas supply system configured to supply, into the reaction chamber, a silicon source gas, a film formation reaction gas, and a gas for cleaning an interior of the reaction chamber; and a control section configured to control an operation of the apparatus and preset to execute a method that comprises performing a film formation process arranged to supply the silicon source gas and the film formation reaction gas into the reaction chamber to form the thin film by CVD on the target substrates accommodated in the reaction chamber, and performing a main cleaning process and a post cleaning process in this order inside the reaction chamber without the target substrates accommodated therein to remove a film formation by-product containing silicon, generated by the film formation process, and deposited inside the reaction chamber, wherein the main cleaning process is arranged to supply a cleaning gas containing fluorine into the reaction chamber while exhausting gas from inside the reaction chamber, thereby etching the film formation by-product, and the post cleaning process is arranged to remove a silicon-containing fluoride generated by the main cleaning process and remaining inside the reaction chamber and to alternately repeat, a plurality of times, supplying an oxidizing gas into the reaction chamber to transform the silicon-containing fluoride into an intermediate product by oxidization, and supplying hydrogen fluoride gas into the reaction chamber while exhausting gas from inside the reaction chamber to remove the intermediate product by a reaction between the hydrogen fluoride gas and the intermediate product.

According to a fourth aspect of the present invention, there is provided a computer readable medium containing program instructions for execution on a processor, wherein the program instructions, when executed by the processor, control a film formation apparatus to conduct the method according to the first aspect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
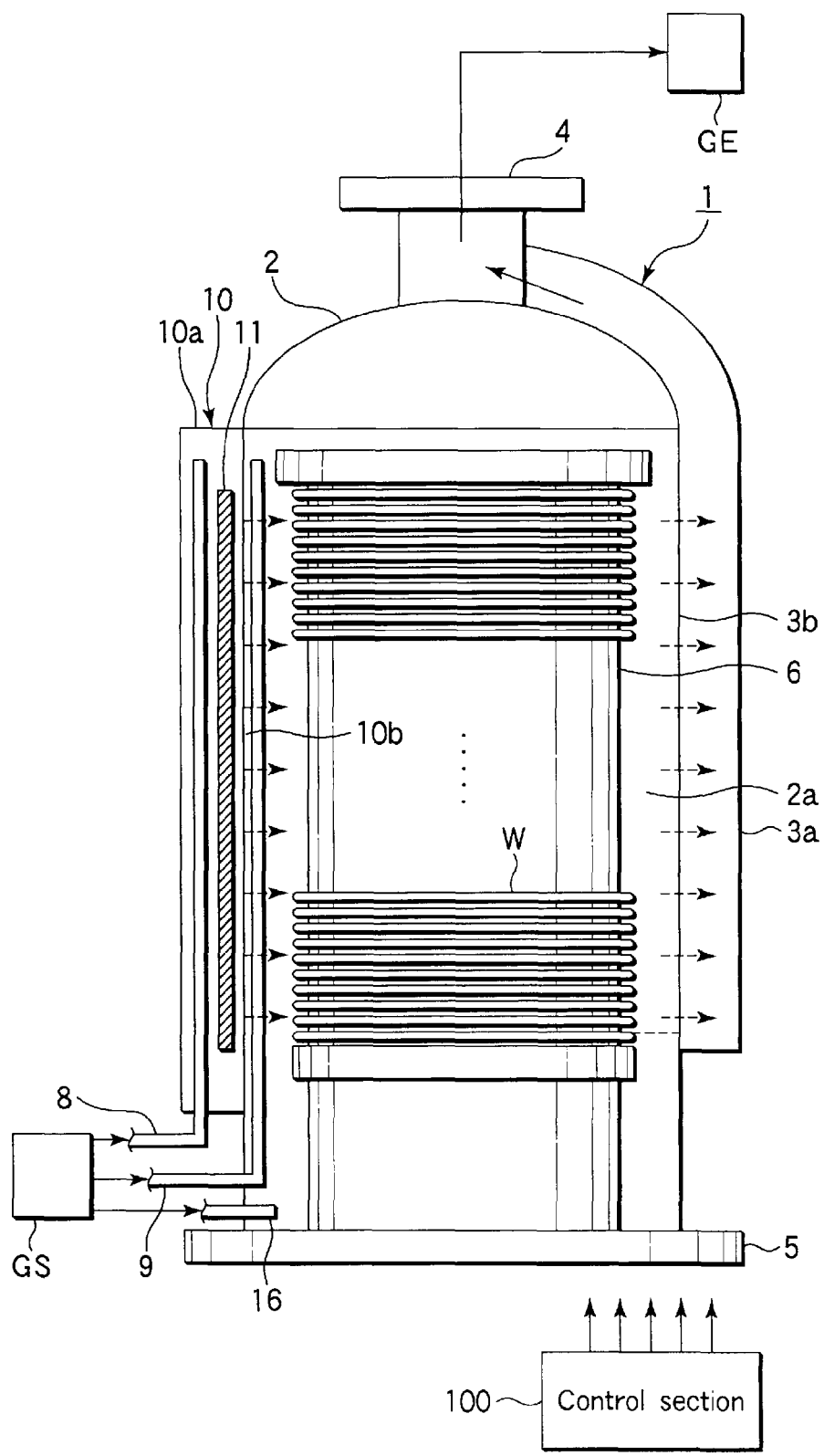
FIG. 1 is a sectional view showing a film formation apparatus (vertical plasma CVD apparatus) according to an embodiment of the present invention.

In the process of developing the present invention, the inventors studied problems with regard to conventional methods for using a film formation apparatus for a semiconductor process, where the methods include a cleaning process for a reaction chamber. As a result, the inventors have arrived at the findings given below.

In recent years, owing to the demands of increased miniaturization and integration of semiconductor integrated circuits, it is required to alleviate the thermal history of semiconductor devices in manufacturing steps, thereby improving the characteristics of the devices. For film formation apparatuses, it is also required to improve semiconductor processing methods in accordance with the demands described above. For example, as a film formation process using CVD, there is a method for performing film formation while alternately supplying a source gas and a reactive gas to repeatedly form layers each having an atomic or molecular level thickness, one by one, or several by several. In general, this film formation process is called ALD (Atomic layer Deposition) or MLD (Molecular Layer Deposition). Further, there is a method of activating a film formation reactive gas by plasma to promote the film formation reaction. Where these methods are adopted, a predetermined process can be performed without exposing wafers to a high temperature.

In film formation apparatuses that can perform a film formation process at a low temperature, such as room temperature, in this way, a gas containing fluorine is used as a cleaning gas to remove by-product films containing silicon and deposited inside the reaction tube. However, where a gas containing fluorine is used for cleaning processes of this kind, it is necessary to heat the interior of the reaction tube to a temperature of 100° C. or more in order to remove silicon-containing fluorides. Accordingly, where a film formation process is performed at a room temperature before and after a cleaning process of this kind, the temperature inside the reaction tube needs to be increased from room temperature to 100° C. or more and then to be returned to room temperature. It takes a long time to execute such temperature adjustment, particularly cooling inside the reaction tube from a temperature of 100° C. or more to room temperature, thereby deteriorating the throughput of the apparatus. Further, film formation apparatuses that can perform a film formation process at a low temperature may include no heater for heating the interior of the reaction tube. In this case, the reaction tube requires a heater to be attached thereon for the cleaning process, thereby bringing about problems in labor and cost.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
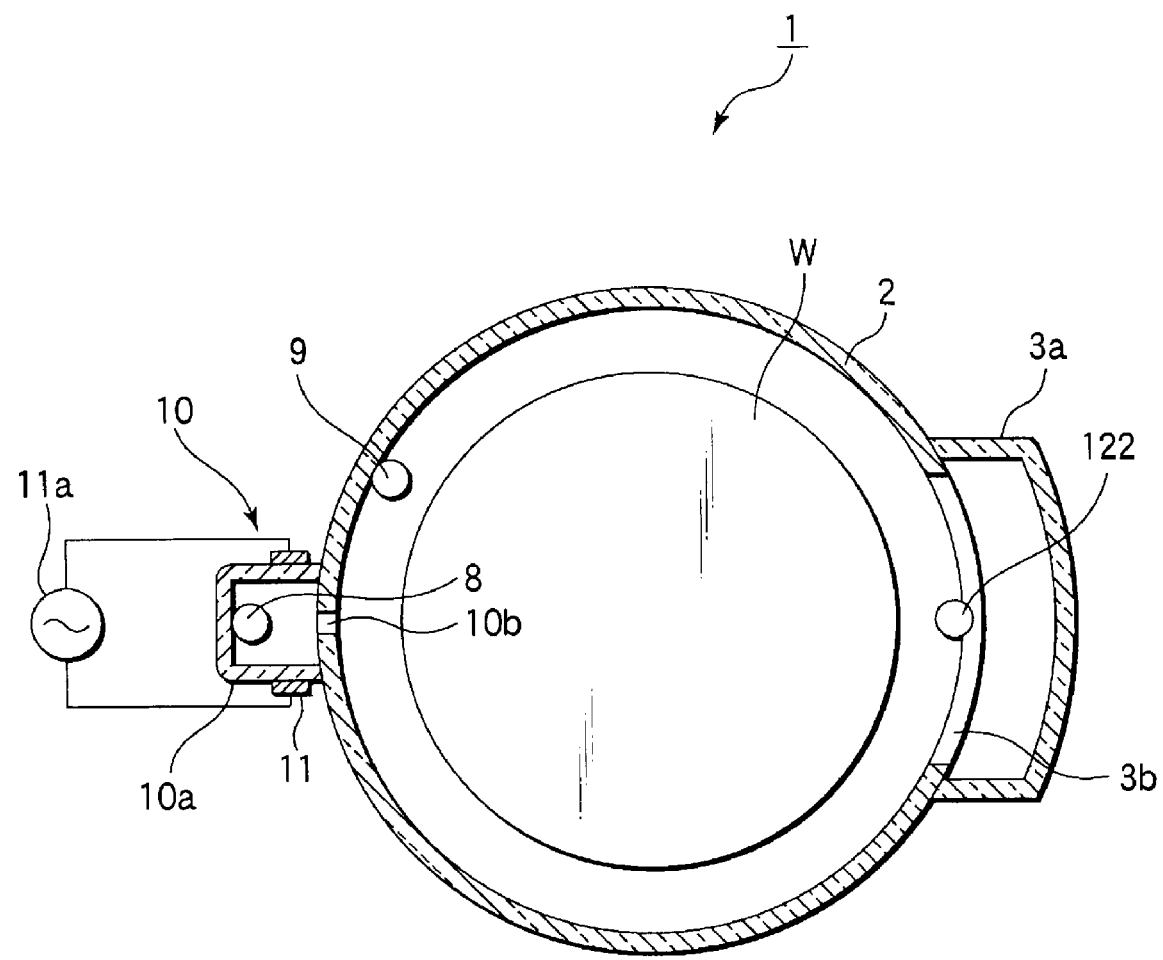
FIG. 2 is a sectional plan view showing part of the apparatus shown in FIG. 1.

FIG. 1 is a sectional view showing a film formation apparatus (vertical plasma CVD apparatus) according to an embodiment of the present invention. FIG. 2 is a sectional plan view showing part of the apparatus shown in FIG. 1. This film formation apparatus is structured as a vertical processing apparatus of the batch type for forming a silicon oxide film on a plurality of semiconductor wafers W by MLD (Molecular Layer Deposition).

As shown in FIG. 1, the film formation apparatus 1 includes an essentially cylindrical reaction tube (reaction chamber) 2 arranged such that its top is closed and the longitudinal direction is set in the vertical direction. The reaction tube 2 is made of a corrosion-resistant material, such as quartz. In the reaction tube 2, a process field 2a is defined to accommodate and process a plurality of semiconductor wafers (target substrates) stacked at intervals in the vertical direction.

On one side of the reaction tube 2, a long narrow exhaust port 3b for vacuum-exhausting the inner atmosphere is formed by cutting the sidewall of the reaction tube 2 in, e.g., the vertical direction. The exhaust port 3b is covered with an exhaust cover member 3a, which is made of quartz with a U-shape cross-section and attached by welding. The exhaust cover member 3a extends upward along the sidewall of the reaction tube 2, and has a gas outlet 4 at the top of the reaction tube 2. The gas outlet 4 is connected to an exhaust section GE through an airtight exhaust line. The exhaust section GE has a pressure adjusting mechanism including, e.g., a valve and a vacuum exhaust pump (not shown in FIG. 1, but shown in FIG. 3 with a reference symbol 127). The exhaust section GE is used to exhaust the atmosphere inside the reaction tube 2, and set it at a predetermined pressure (vacuum level).

A lid 5 is disposed below the reaction tube 2. The lid 5 is made of a corrosion-resistant material, such as quartz. The lid 5 is moved up and down by a boat elevator described later (not shown in FIG. 1, but shown in FIG. 3 with a reference symbol 128). When the lid 5 is moved up by the boat elevator, the bottom of the reaction tube 2 (load port) is closed. When the lid 5 is moved down by the boat elevator, the bottom of the reaction tube 2 (load port) is opened.

A wafer boat 6 made of, e.g., quartz is placed on the lid 5. The wafer boat 6 is configured to hold a plurality of semiconductor wafers W at predetermined intervals in the vertical direction. A thermally insulating cylinder may be disposed on the lid 5 to prevent the temperature inside the reaction tube 2 from being lowered due to the load port of the reaction tube 2. Further, a rotary table may be disposed to rotatably mount thereon the wafer boat 6 that holds the wafers W.

Gas distribution nozzles 8 and 9 and a gas nozzle 16 penetrate the sidewall of the reaction tube 2 near the bottom, and are used for supplying process gases (such as a silicon source gas, an oxidizing gas, a cleaning gas, and an inactive gas for dilution, purge, or pressure control) into the reaction tube 2. Each of the gas distribution nozzles 8 and 9 and gas nozzle 16 is connected to a process gas supply section GS through a mass-flow controller (MFC) and so forth (not shown). The process gas supply section GS includes gas sources of the reactive gases and a gas source of nitrogen ($N_2$) gas serving as an inactive gas, so as to prepare a first process gas comprising a silicon source gas, a second process gas comprising an oxidizing gas, and a third process gas comprising a cleaning gas, as described below.

Specifically, in this embodiment, in order to form a silicon oxide film (product film) on the wafers W by MLD, di-isopropylaminosilane (DIPAS) gas is used as a silicon source gas in the first process gas and oxygen ($O_2$) gas is used as an oxidizing gas in the second process gas. Further, in order to etch and remove by-product films, which contain silicon oxide as the main component (it means 50% or more), deposited inside the reaction tube 2, hydrogen fluoride (HF) gas is used as a cleaning gas in the third process gas. Each of the first to third process gases may be mixed with a suitable amount of carrier gas (dilution gas, such as $N_2$ gas), as needed. However, such a carrier gas will be mentioned only when necessary, hereinafter, for the sake of simplicity of explanation.

The gas distribution nozzle 8 is connected to gas sources of $O_2$ gas and $N_2$ gas, the gas distribution nozzle 9 is connected to gas sources of DIPAS gas, HF gas, and $N_2$ gas, and the gas nozzle 16 is connected to a gas source of $N_2$ gas. These gas sources are disposed in the process gas supply section GS.

Each of the gas distribution nozzles 8 and 9 is formed of a quartz pipe which penetrates the sidewall of the reaction tube 2 from the outside and then turns and extends upward (see FIG. 1). Each of the gas distribution nozzles 8 and 9 has a plurality of gas spouting holes, each set of holes being formed at predetermined intervals in the longitudinal direction (the vertical direction) over all the wafers W on the wafer boat 6. Each set of the gas spouting holes delivers the corresponding process gas almost uniformly in the horizontal direction, so as to form gas flows parallel with the wafers W on the wafer boat 6. On the other hand, the gas nozzle 16 used only for the inactive gas is formed of a short gas nozzle, which penetrates the sidewall of the reaction tube 2 from the outside.

A plasma generation section 10 is attached to the sidewall of the reaction tube 2 and extends in the vertical direction. The plasma generation section 10 has a vertically long narrow opening 10b formed by cutting a predetermined width of the sidewall of the reaction tube 2, in the vertical direction. The opening 10b is covered with a quartz cover 10a airtightly connected to the outer surface of the reaction tube 2 by welding. The cover 10a has a vertically long narrow shape with a concave cross-section, so that it projects outward from the reaction tube 2.

With this arrangement, the plasma generation section 10 is formed such that it projects outward from the sidewall of the reaction tube 2 and is opened on the other side to the interior of the reaction tube 2. In other words, the inner space of the plasma generation section 10 communicates with the process space inside the reaction tube 2. The opening 10b has a vertical length sufficient to cover all the wafers W on the wafer boat 6 in the vertical direction.

A pair of long narrow electrodes 11 are disposed on the opposite outer surfaces of the cover 10a, and face each other while extending in the longitudinal direction (the vertical direction). The electrodes 11 are connected to an RF (Radio Frequency) power supply 11a for plasma generation, through feed lines. An RF voltage of, e.g., 13.56 MHz is applied to the electrodes 11 to form an RF electric field for exciting plasma between the electrodes 11. The frequency of the RF voltage is not limited to 13.56 MHz, and it may be set at another frequency, e.g., 400 kHz.

The gas distribution nozzle 8 of the second process gas is bent outward in the radial direction of the reaction tube 2, at a position lower than the lowermost wafer W on the wafer boat 6. Then, the gas distribution nozzle 8 vertically extends at the deepest position (the farthest position from the center of the reaction tube 2) in the plasma generation section 10. As shown also in FIG. 2, the gas distribution nozzle 8 is separated outward from an area sandwiched between the pair of electrodes 11 (a position where the RF electric field is most intense), i.e., a plasma generation area where the main plasma is actually generated. The second process gas comprising $O_2$ gas is spouted from the gas spouting holes of the gas distribution nozzle 8 toward the plasma generation area. Then, the second process gas is excited (decomposed or activated) in the plasma generation area, and is supplied in this state along with radicals containing oxygen atoms ($O^*$ and $O_2^*$) onto the wafers W on the wafer boat 6 (the symbol [*] denotes that it is a radical).

At a position near and outside the opening 10b of the plasma generation section 10, the gas distribution nozzle 9 of the first process gas is disposed. The gas distribution nozzle 9 extends vertically upward on one side of the outside of the opening 10b (inside the reaction tube 2). The first process gas comprising DIPAS gas or the third process gas containing HF gas is spouted from the gas spouting holes of the gas distribution nozzle 9 toward the center of the reaction tube 2. Accordingly, the first process gas or third process gas supplied from the gas distribution nozzle 9 is not turned into plasma (or activated) by the plasma generation section 10.

A plurality of temperature sensors, such as thermocouples, (not shown in FIG. 1, but shown in FIG. 3 with a reference symbol 122) for measuring the temperature inside the reaction tube 2 and a plurality of pressure gages (not shown in FIG. 1, but shown in FIG. 3 with a reference symbol 123) for measuring the pressure inside the reaction tube 2 are disposed inside the reaction tube 2.

Figure 3:
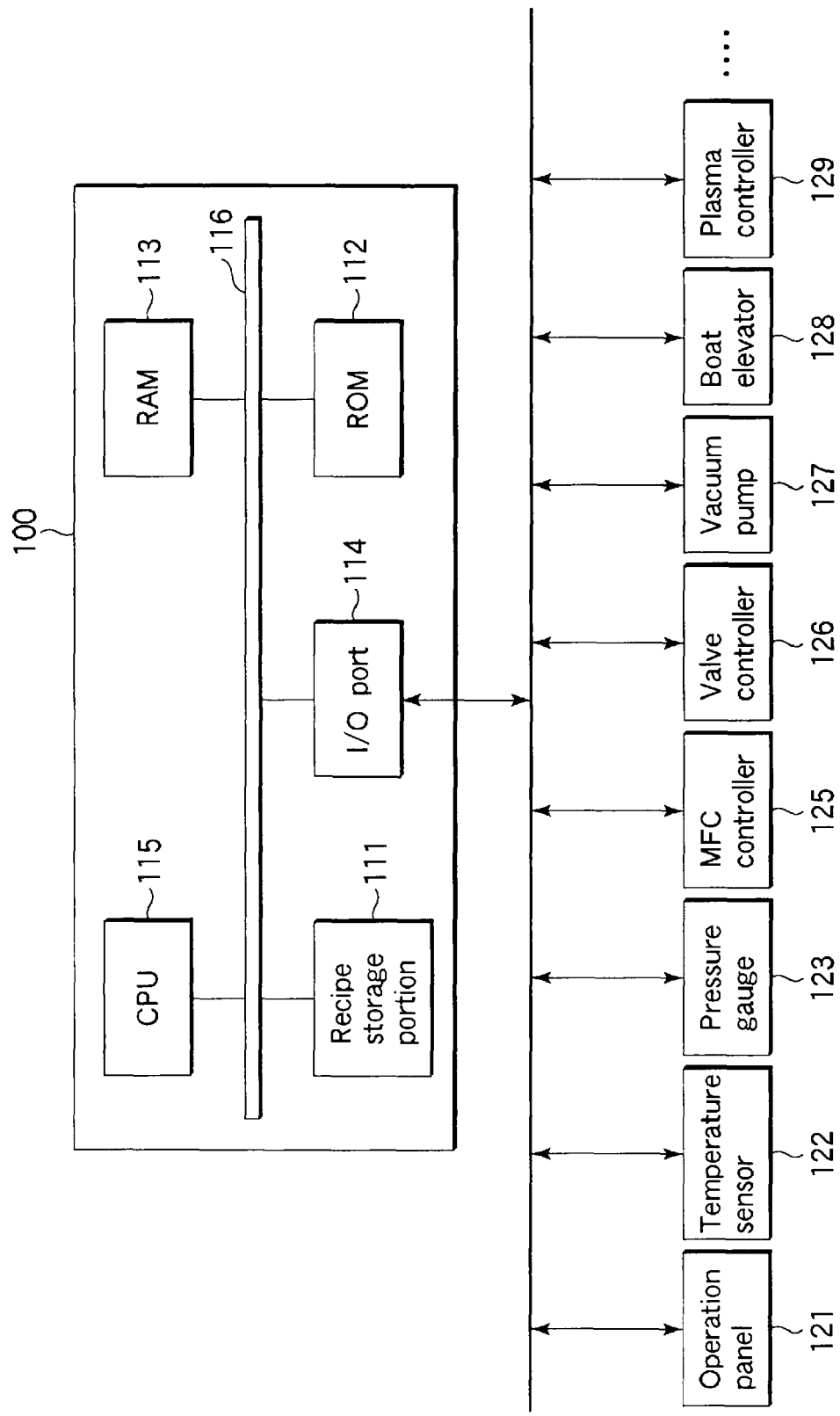
FIG. 3 is a view showing the structure of the control section of the apparatus shown in FIG. 1.

The film formation apparatus 1 further includes a control section 100 for controlling respective portions of the apparatus. FIG. 3 is a view showing the structure of the control section 100. As shown in FIG. 3, the control section 100 is connected to an operation panel 121, (a group of) temperature sensors 122, (a group of) pressure gages 123, MFC controllers 125, valve controllers 126, a vacuum pump 127, a boat elevator 128, a plasma controller 129, and so forth.

The operation panel 121 includes a display screen and operation buttons, and is configured to transmit operator's instructions to the control section 100, and show various data transmitted from the control section 100 on the display screen. The (group of) temperature sensors 122 are configured to measure the temperature at respective portions inside the reaction tube 2, exhaust line, and so forth, and to transmit measurement values to the control section 100. The (group of) pressure gages 123 are configured to measure the pressure at respective portions inside the reaction tube 2, exhaust line, and so forth, and to transmit measurement values to the control section 100.

The MFC controllers 125 are configured to respectively control the MFCs (not shown) connected to the gas distribution nozzles 8 and 9 and the gas nozzle 16. The MFC controllers 125 control the flow rates of gases flowing through the MFCs in accordance with instructions from the control section 100. Further, the MFC controllers 125 measure the flow rates of gases flowing through the MFCs, and transmit them to the control section 100.

The valve controllers 126 are respectively disposed on piping lines and configured to control the opening rate of valves disposed on piping lines in accordance with instructed values received from the control section 100. The vacuum pump 127 is connected to the exhaust line and configured to exhaust gas from inside the reaction tube 2.

The boat elevator 128 is configured to move up the lid 5, so as to load the wafer boat 6 (wafers W) into the reaction tube 2. The boat elevator 128 is also configured to move the lid 5 down, so as to unload the wafer boat 6 (wafers W) from the reaction tube 2.

The plasma controller 129 is configured to control the plasma generation section 10 in accordance with instructions from the control section 100, so that oxygen gas supplied into the plasma generation section 10 is activated to generate oxygen radicals.

The control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the film formation apparatus 1 is manufactured, only the setup recipe is initially stored. The setup recipe is executed when a thermal model or the like for a specific film formation apparatus is formed. The process recipes are prepared respectively for heat processes to be actually performed by a user. Each process recipe prescribes temperature changes at respective portions, pressure changes inside the reaction tube 2, start/stop timing for supply of process gases, and supply rates of process gases, from the time wafers W are loaded into the reaction tube 2 to the time the processed wafers W are unloaded.

The ROM 112 is a storage medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, MFC controllers 125, valve controllers 126, vacuum pump 127, boat elevator 128, and plasma controller 129, and is configured to control output/input of data or signals.

The CPU (Central Processing Unit) 115 is the hub of the control section 100. The CPU 115 is configured to run control programs stored in the ROM 112, and control an operation of the film formation, apparatus 1, in accordance with a recipe (process recipe) stored in the recipe storage portion 111, following instructions from the operation panel 121. Specifically, the CPU 115 causes the (group of) temperature sensors 122, (group of) pressure gages 123, and MFC controllers 125 to measure temperatures, pressures, and flow rates at respective portions inside the reaction tube 2, exhaust line, and so forth. Further, the CPU 115 outputs control signals, based on measurement data, to the MFC controllers 125, valve controllers 126, and vacuum pump 127, to control the respective portions mentioned above in accordance with a process recipe.

Figure 4:
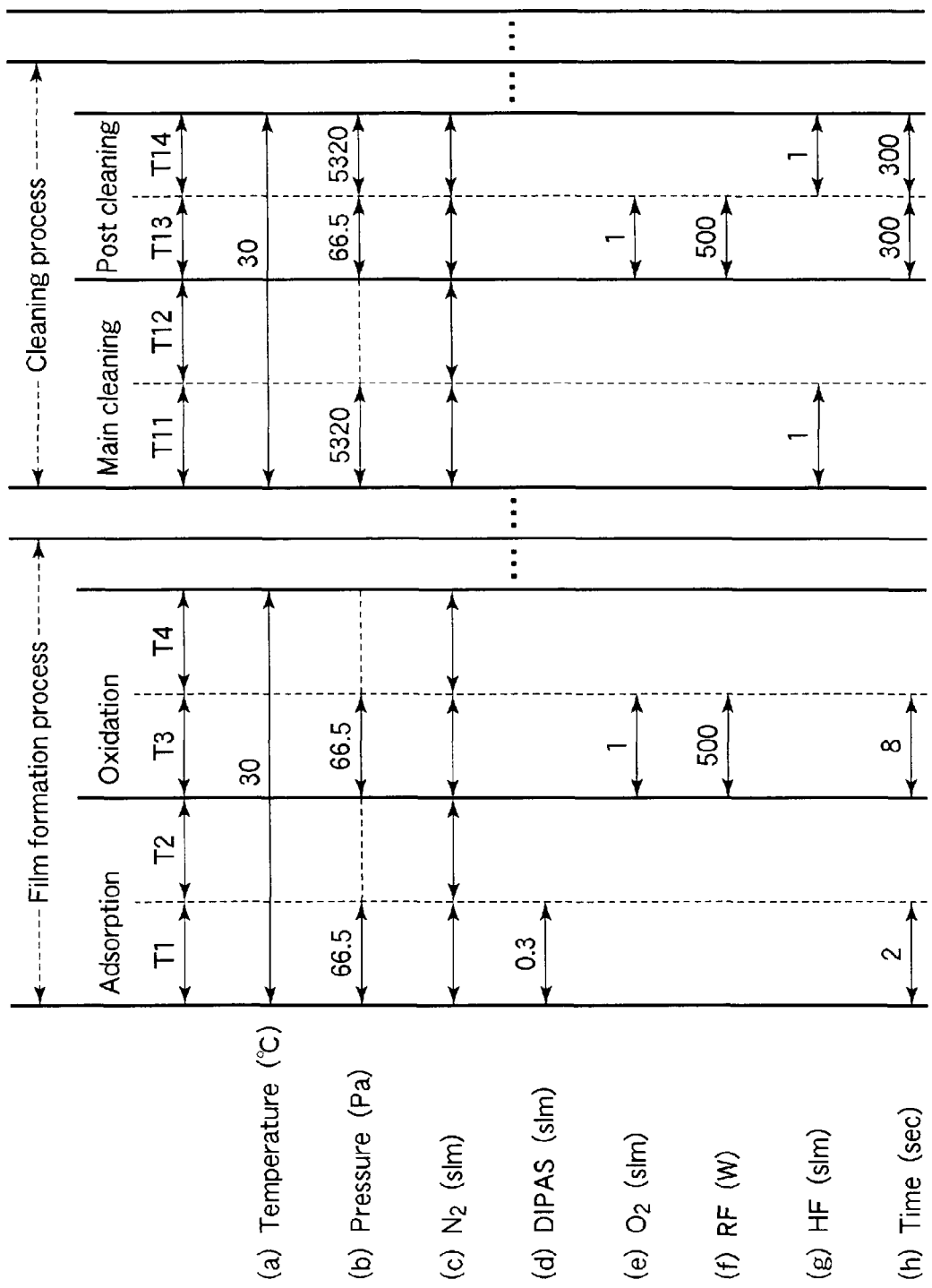
FIG. 4 is a timing chart showing the recipe of a film formation process and a cleaning process according to the embodiment of the present invention.

Next, an explanation will be given of a method for using the film formation apparatus 1 described above, with reference to FIG. 4. In outline, at first, a film formation process (so-called MLD film formation) is performed to form a silicon oxide film on semiconductor wafers W inside the reaction tube 2. Then, a cleaning process is performed to remove by-product films, which contain silicon oxide as the main component (it means 50% or more), deposited inside the reaction tube 2. FIG. 4 is a timing chart showing the recipe of a film formation process and a cleaning process according to the embodiment of the present invention.

It should be noted that, in order to improve the throughput, the temperature of the process field 2a is preferably set to be constant during the film formation and cleaning process. Accordingly, in this embodiment, the temperature inside the reaction tube 2 is set at the same temperature of −32° C. to 100° C., such as room temperature (e.g., 30° C.) during the film formation process and cleaning process. If the temperature inside the reaction tube 2 is lower than −32° C., supply of DIPAS serving as a silicon source gas may be hindered. This is so, because, in consideration of a pressure loss caused by the process gas supply line, MFC, nozzle 9, and so forth connected to the DIPAS gas source, the lower limit temperature for providing a practicable vapor pressure of DIPAS is −32° C. On the other hand, if the temperature inside the reaction tube 2 is higher than 100° C., it becomes difficult to provide the effect of effectively performing the film formation process and cleaning process. The temperature inside the reaction tube 2 is preferably set to be within a range of from room temperature (e.g., 25° C. to 35° C.) to 80° C., more preferably of from room temperature to 60° C., and furthermore preferably at room temperature.

The respective components of the film formation apparatus 1 described below are operated under the control of the control section 100 (CPU 115). The temperature and pressure inside the reaction tube 2 and the gas flow rates during the processes are set in accordance with the recipe shown in FIG. 4, while the control section 100 (CPU 115) controls the MFC controllers 125 (for the gas distribution nozzles 8 and 9 and gas nozzle 16), valve controllers 126, vacuum pump 127, and plasma controller 129 (plasma generation section 10), as described above.

<Film Formation Process>

At first, the wafer boat 6 set at room temperature, which supports a number of, e.g., 50 to 100, wafers having a diameter of 300 mm, is placed on the lid 5. Then, the lid 5 is moved up by the boat elevator 128, so that wafer boat 6 is loaded to the process field 2a inside the reaction tube 2 and the reaction tube 2 is airtightly closed. At this time, the process field 2a is set at a predetermined temperature, i.e., room temperature (e.g., 30° C.) in this embodiment because the reaction tube 2 is not heated. Then, the interior of the reaction tube 2 is vacuum-exhausted and kept at a predetermined process pressure. Then, while the wafer boat 6 is rotated, the first and second process gases are intermittently supplied from the respective gas distribution nozzles 9 and 8 at controlled flow rates.

In summary, at first, the first process gas comprising DIPAS gas is supplied from the gas spouting holes of the gas distribution nozzle 9 to form gas flows parallel with the wafers W on the wafer boat 6. While being supplied, molecules of the DIPAS gas and molecules and atoms of decomposition products generated by gas decomposition are adsorbed on the surface of the wafers W to form an adsorption layer (adsorption stage).

Then, the second process gas comprising $O_2$ gas is supplied from the gas spouting holes of the gas distribution nozzle 8 to form gas flows parallel with the wafers W on the wafer boat 6. The second process gas is selectively excited and partly turned into plasma when it passes through the plasma generation area between the pair of electrodes 11. At this time, oxygen radicals (activated species), such as $O^*$ and $O_2^*$, are produced. The radicals flow out from the opening 10b of the plasma generation section 10 toward the center of the reaction tube 2, and are supplied into gaps between the wafers W in a laminar flow state. When oxygen radicals are supplied onto the wafers W, they react with Si in the adsorption layer on the wafers W, and a thin film of silicon oxide is thereby formed on the wafers W (oxidation stage).

As shown in FIG. 4, the film formation process according to this embodiment is arranged to alternately repeat first to fourth steps T1 to T4 so as to alternately repeat the adsorption and oxidation stages. A cycle comprising the first to fourth steps T1 to T4 is repeated a number of times, such as 100 times, and thin films of silicon oxide formed by respective times are laminated, thereby arriving at a silicon oxide film having a target thickness.

The first step T1 is arranged to perform supply of DIPA gas to the process field 2a, while maintaining a shut-off state of supply of $O_2$ gas to the process field 2a. The second step T2 is arranged to maintain the shut-off state of supply of the DIPA gas and $O_2$ gas to the process field 2a. The third step T3 is arranged to perform supply of the $O_2$ gas to the process field 2a, while maintaining the shut-off state of supply of the DIPA gas to the process field 2a. Further, through the third step T3, the RF power supply 11a is set in an ON state to turn the $O_2$ gas into plasma by the plasma generation section 10, so as to supply the $O_2$ gas in an activated state to the process field 2a. The fourth step T4 is arranged to maintain the shut-off state of supply of the DIPA gas and $O_2$ gas to the process field 2a. Vacuum-exhaust of the reaction tube 2 and supply of $N_2$ gas serving as a dilution or purge gas into the reaction tube 2 are kept performed over the first to fourth steps T1 to T4.

Specifically, in the adsorption stage, at first, while nitrogen gas is supplied from the gas distribution nozzle 9 to the process field 2a at a predetermined flow rate, as shown in FIG. 4, (c), the process field 2a is set at a predetermined temperature, such as room temperature (e.g., 30° C.), as shown in FIG. 4, (a). In this case, since the process field 2a is set at room temperature, the reaction tube 2 is not heated. Further, the reaction tube 2 is exhausted to set the process field 2a at a predetermined pressure, such as 66.5 Pa (0.5 Torr), as shown in FIG. 4, (b). Then, DIPAS gas is supplied from the gas distribution nozzle 9 to the process field 2a at a predetermined flow rate, such as 0.3 slm, as shown in FIG. 4, (d), and nitrogen gas is also supplied to the process field 2a at a predetermined flow rate, as shown in FIG. 4, (c) (T1: flow step).

After the flow step of the adsorption stage is performed for 1 to 3 seconds, such as 2 seconds, as shown in FIG. 4, (h), the supply of DIPAS gas is stopped. On the other hand, nitrogen gas is kept supplied from the nozzles 8, 9, and 16 to the process field 2a at a predetermined flow rate, as shown in FIG. 4, (c). Further, the reaction tube 2 is exhausted to exhaust gas from the process field 2a (T2: purge step).

In the oxidation stage subsequently performed, at first, while nitrogen gas is supplied from the gas distribution nozzle 9 to the process field 2a at a predetermined flow rate, as shown in FIG. 4, (c), the process field 2a is set at a predetermined temperature, such as room temperature (e.g., 30° C.), as shown in FIG. 4, (a). At this time, the reaction tube 2 is exhausted to set the process field 2a at a predetermined pressure, such as 66.5 Pa (0.5 Torr), as shown in FIG. 4, (b). Then, an RF power of 500 W is applied between the electrodes 11 (RF: ON), as shown in FIG. 4, (f). Further, oxygen gas is supplied from the gas distribution nozzle 8 to a position between the electrodes 11 (inside the plasma generation section 10) at a predetermined flow rate, such as 1 slm, as shown in FIG. 4, (e). The oxygen gas thus supplied is excited (activated) into plasma between the electrodes 11 and generates radicals containing oxygen atoms ($O^*$ and $O_2^*$). The radicals containing oxygen atoms thus generated are supplied from the plasma generation section 10 to the process field 2a. Further, nitrogen gas is also supplied from the gas distribution nozzle 9 to the process field 2a at a predetermined flow rate, as shown in FIG. 4, (c) (T3: flow step).

After the flow step of the oxidation stage is performed for 5 to 30 seconds, such as 8 seconds, as shown in FIG. 4, (h), the supply of oxygen gas is stopped and the application of RF power is stopped. On the other hand, nitrogen gas is kept supplied from the nozzles 8, 9, and 16 to the process field 2a at a predetermined flow rate, as shown in FIG. 4, (c). Further, the reaction tube 2 is exhausted to exhaust gas from the process field 2a (T4: purge step).

As described above, a cycle alternately comprising the adsorption and oxidation stages in this orders is repeated a predetermined number of times. In each cycle, DIPAS is supplied onto the wafers W to form an adsorption layer, and then radicals containing oxygen atoms are supplied to oxidize the adsorption layer, so as to form a silicon oxide film. As a result, a silicon oxide film of high quality can be formed with high efficiency.

When the silicon oxide film formed on the surface of the semiconductor wafers W reaches a predetermined thickness, the wafers W are unloaded. Specifically, nitrogen gas is supplied into the reaction tube 2 at a predetermined flow rate, so that the pressure inside the reaction tube 2 is returned to atmospheric pressure. Then, the lid 5 is moved down by the boat elevator 128, and the wafer boat 6 is thereby unloaded out of the reaction tube 2 along with the wafers W.

According to the film formation process described above, DIPAS serving as a silicon source gas is a univalent aminosilane and makes nitrogen hardly contained in a silicon oxide film to be formed, whereby a silicon oxide film of higher quality is obtained, as compared with processes using bivalent to quadrivalent aminosilanes as a silicon source gas. Further, in this case, structural impediments, which impede molecule adsorption, can hardly occur when the adsorption layer is formed, and the adsorption rate is not decreased, whereby a high film formation rate is maintained. Further, DIPAS is thermally stable and facilitates its flow rate control such that conventional systems can be used for the source supply, resulting in high versatility.

The flow rate of the DIPAS gas is preferably set to be 10 sccm to 10 slm. If the flow rate is lower than 10 sccm, the DIPAS supply onto the surface of the wafers W may become insufficient. If the flow rate is higher than 10 slm, the DIPAS ratio contributory to adsorption onto the surface of the wafers W may become too low. The flow rate of DIPAS gas is more preferably set to be 0.05 slm to 3 slm. This flow rate range makes it possible to promote the DIPAS reaction on the surface of the wafers W.

The pressure of the process field 2a (process pressure) in the DIPAS supply is preferably set to be 0.133 Pa (1 mTorr) to 13.3 kPa (100 Torr). This pressure range makes it possible to promote the DIPAS reaction on the surface of the wafers W.

The flow rate of the oxygen gas is preferably set to be 0.1 sccm to 10 slm. This flow rate range makes it possible to generate plasma without difficulty and to supply oxygen radicals sufficient to form a silicon oxide film. The flow rate of oxygen gas is more preferably set to be 0.5 slm to 5 slm. This pressure range makes it possible to stably generate plasma.

The RF power is preferably set to be 10 to 1,500 W. If the power is lower than 10 W, it is difficult to generate oxygen radicals. If the power is higher than 1,500 W, the quartz wall of the plasma generation section 10 may be damaged. The RF power is more preferably set to be 50 to 500 W. This power range makes it possible to efficiently generate radicals.

The pressure of the process field 2a (process pressure) in the oxygen supply is preferably set to be 0.133 Pa (1 mTorr) to 13.3 kPa (100 Torr). This pressure range makes it possible to easily generate oxygen radicals and to increase the mean free path of oxygen radicals in the process field 2a. This pressure is more preferably set to be 25 Pa (0.2 Torr) to 400 Pa (3 Torr). This pressure range makes it possible to easily control the pressure of the process field 2a.

The pressure inside the plasma generation section 10 (the pressure at the gas spouting holes) is preferably set to be 0.133 Pa (1 mTorr) to 13.3 kPa (100 Torr), and more preferably to be 70 Pa (0.53 Torr) to 400 Pa (3 Torr). This pressure range makes it possible to generate plasma without difficulty and to supply oxygen radicals sufficient to form a silicon oxide film.

<Cleaning Process>

When the film formation process described above is repeated a plurality of times, silicon oxide produced by the film formation process is deposited (adhered) not only on the surface of semiconductor wafers W, but also on the inner surface of the reaction tube 2 and so forth, as by-product films. Accordingly, after the film formation process is repeated a predetermined number of times, a cleaning process is performed inside the reaction tube 2 to remove by-product films (film formation by-products) containing silicon oxide as the main component and deposited inside the reaction tube 2.

As shown in FIG. 4, the cleaning process according to this embodiment is arranged to execute a main cleaning process and a post cleaning process in this order inside the reaction tube 2 with no film formation semiconductor wafers placed therein while continuously exhausting gas from inside the reaction tube 2 and setting the temperature inside the reaction tube at room temperature (e.g., 30° C.), for example. In the main cleaning process, a cleaning gas containing fluorine, such as hydrogen fluoride (HF) gas, is supplied into the reaction tube 2 to etch and thereby remove film formation by-products generated by the film formation process and deposited inside the reaction tube 2. In the post cleaning process, a cycle comprising an oxidation stage and a removal stage is repeated a plurality of times, such as 10 times, to remove silicon-containing fluorides, such as fluorosilicate, generated by the main cleaning process and remaining inside the reaction tube 2. The oxidation stage of this cycle comprises supplying an oxidizing gas, such as oxygen ($O_2$) gas, into the reaction tube 2 to oxidize the silicon-containing fluorides and thereby to transform them into intermediate products. The removal stage comprises supplying hydrogen fluoride gas into the reaction tube 2 to cause hydrogen fluoride gas to react with the intermediate products so as to remove the intermediate products by etching and so forth.

Specifically, at first, the reaction tube 2 is set at a predetermined temperature, such as room temperature (30° C.), as shown in FIG. 4, (a). Further, nitrogen gas is supplied from the gas distribution nozzle 9 into the reaction tube 2 at a predetermined flow rate, as shown in FIG. 4, (c). The wafer boat 6 set at room temperature with no semiconductor wafers W supported thereon is placed on the lid 5. Then, the lid 5 is moved up by the boat elevator 128, so that wafer boat 6 is loaded into the reaction tube 2 and the reaction tube 2 is airtightly closed.

Then, in order to start the main cleaning process, nitrogen gas is supplied from the gas distribution nozzle 9 into the reaction tube 2 at a predetermined flow rate, as shown in FIG. 4, (c). Further, gas is exhausted from inside the reaction tube 2 to set the interior of the reaction tube 2 at a predetermined pressure, such as 5,320 Pa (40 Torr), as shown in FIG. 4, (b). Then, a cleaning gas is supplied from the gas distribution nozzle 9 into the reaction tube 2 at a predetermined flow rate. In this embodiment, hydrogen fluoride gas is supplied at, e.g., 1 slm, as shown in FIG. 4, (g), and nitrogen gas is supplied at a predetermined flow rate, as shown in FIG. 4, (c), (T11: flow step). The hydrogen fluoride gas supplied into the reaction tube 2 reacts with the film formation by-products deposited inside the reaction tube 2 and etches and thereby removes them.

The flow rate of the hydrogen fluoride gas is preferably set to be 10 sccm to 10 slm. If the flow rate is lower than 10 sccm, hydrogen fluoride to be supplied onto the film formation by-products deposited inside the reaction tube 2 may become insufficient. If the flow rate is higher than 10 slm, the ratio of the hydrogen fluoride gas contributory to the reaction may become too low. The flow rate of the hydrogen fluoride gas is more preferably set to be 0.05 slm to 3 slm. This flow rate range makes it possible to promote the reaction between the film formation by-products and hydrogen fluoride gas.

The pressure inside the reaction tube 2 in the hydrogen fluoride supply is preferably set to be 0.133 Pa (1 mTorr) to 101.3 kPa (760 Torr), and more preferably to be 2.666 kPa (20 Torr) to 46.65 kPa (350 Torr). This pressure range makes it possible to promote the reaction between the film formation by-products and hydrogen fluoride gas.

After the flow step of the main cleaning process is performed for a predetermined time, the supply of hydrogen fluoride gas from the gas distribution nozzle 9 is stopped. On the other hand, nitrogen gas is kept supplied from the nozzles 8, 9, and 16 into the reaction tube 2 at a predetermined flow rate, as shown in FIG. 4, (c). Further, the reaction tube 2 is exhausted to exhaust gas from inside the reaction tube 2 (T12: purge step).

In the main cleaning process described above, the film formation by-products containing silicon oxide as the main component are etched and thereby removed by the hydrogen fluoride gas. However, at this time, silicon-containing fluorides are generated as by-products by this reaction and partly remain as, e.g., deposits on the inner surface of the reaction tube 2. Accordingly, subsequently to the main cleaning process, a post cleaning process is performed by repeating a plurality of times a cycle comprising an oxidation stage and a removal stage to remove the silicon-containing fluorides remaining inside the reaction tube 2.

In the oxidation stage of the post cleaning process, at first, nitrogen gas is supplied from the gas distribution nozzle 9 into the reaction tube 2 at a predetermined flow rate, as shown in FIG. 4, (c). Further, gas is exhausted from inside the reaction tube 2 to set the interior of the reaction tube 2 at a predetermined pressure, such as 66.5 Pa (0.5 Torr), as shown in FIG. 4, (b). Then, an RF power of 500 W is applied between the electrodes 11 (RF: ON), as shown in FIG. 4, (f). Further, oxygen gas is supplied from the gas distribution nozzle 8 to a position between the electrodes 11 (inside the plasma generation section 10) at a predetermined flow rate, such as 1 slm, as shown in FIG. 4, (e). The oxygen gas thus supplied is excited (activated) into plasma between the electrodes 11 and generates radicals containing oxygen atoms (O* and $O_2$*). The radicals containing oxygen atoms thus generated are supplied from the plasma generation section 10 into the reaction tube 2. Further, nitrogen gas is also supplied from the gas distribution nozzle 9 into the reaction tube 2 at a predetermined flow rate, as shown in FIG. 4, (c) (T13: flow step). When the oxygen radicals are supplied into the reaction tube 2, the silicon-containing fluorides remaining inside the reaction tube 2 are oxidized, and intermediate products are thereby generated.

After the flow step of the oxidation stage is performed for, e.g., 300 seconds (5 minutes), as shown in FIG. 4, (h), the supply of oxygen gas is stopped and the application of RF power is stopped. On the other hand, nitrogen gas is kept supplied from the nozzles 8, 9, and 16 into the reaction tube 2 at a predetermined flow rate.

Then, in the removal stage of the post cleaning process, nitrogen gas is supplied from the gas distribution nozzle 9 into the reaction tube 2 at a predetermined flow rate, as shown in FIG. 4, (c). Further, gas is exhausted from inside the reaction tube 2 to set the interior of the reaction tube 2 at a predetermined pressure, such as 5,320 Pa (40 Torr), as shown in FIG. 4, (b). Then, a cleaning gas is supplied from the gas distribution nozzle 9 into the reaction tube 2 at a predetermined flow rate. In this embodiment, hydrogen fluoride gas is supplied at, e.g., 1 slm, as shown in FIG. 4, (g), and nitrogen gas is supplied at a predetermined flow rate, as shown in FIG. 4, (c), (T14: flow step).

The hydrogen fluoride gas supplied into the reaction tube 2 reacts with the intermediate products generated by the oxidation stage and removes them by etching and so forth. Also in this removal stage, silicon-containing fluorides are generated, but this quantity of silicon-containing fluorides is smaller than that of silicon-containing fluorides generated by the main cleaning process.

After the flow step of the removal stage is performed for, e.g., 300 seconds (5 minutes), as shown in FIG. 4, (h), the supply of hydrogen fluoride gas from the gas distribution nozzle 9 is stopped. On the other hand, nitrogen gas is kept supplied from the nozzles 8, 9, and 16 into the reaction tube 2 at a predetermined flow rate.

In the post cleaning process, the flow rate of the oxygen gas is preferably set to be 0.1 sccm to 10 slm. This flow rate range makes it possible to generate plasma without difficulty and to supply oxygen radicals sufficient to oxidize the silicon-containing fluorides and thereby to form the intermediate products. The flow rate of oxygen gas is more preferably set to be 0.5 slm to 5 slm. This pressure range makes it possible to stably generate plasma.

The RF power is preferably set to be 10 to 1,500 W. If the power is lower than 10 W, it is difficult to generate oxygen radicals. If the power is higher than 1,500 W, the quartz wall of the plasma generation section 10 may be damaged. The RF power is more preferably set to be 50 to 500 W. This power range makes it possible to efficiently generate radicals.

The pressure of the process field 2a (process pressure) in the oxygen supply is preferably set to be 0.133 Pa (1 mTorr) to 13.3 kPa (100 Torr). This pressure range makes it possible to easily generate oxygen radicals and to increase the mean free path of oxygen radicals in the process field 2a. This pressure is more preferably set to be 25 Pa (0.2 Torr) to 400 Pa (3 Torr). This pressure range makes it possible to easily control the pressure of the process field 2a.

The pressure inside the plasma generation section 10 (the pressure at the gas spouting holes) is preferably set to be 0.133 Pa (1 mTorr) to 13.3 kPa (100 Torr), and more preferably to be 70 Pa (0.53 Torr) to 400 Pa (3 Torr). This pressure range makes it possible to generate plasma without difficulty and to supply oxygen radicals sufficient to oxidize the silicon-containing fluorides and thereby to form the intermediate products.

The flow rate of the hydrogen fluoride gas is preferably set to be 10 sccm to 10 slm. If the flow rate is lower than 10 sccm, hydrogen fluoride to be supplied onto the intermediate products may become insufficient. If the flow rate is higher than 10 slm, the ratio of the hydrogen fluoride gas contributory to the reaction may become too low. The flow rate of the hydrogen fluoride gas is more preferably set to be 0.05 slm to 3 slm. This flow rate range makes it possible to promote the reaction between the intermediate products and hydrogen fluoride gas.

The pressure inside the reaction tube 2 in the hydrogen fluoride supply is preferably set to be 0.133 Pa (1 mTorr) to 101.3 kPa (760 Torr), and more preferably to be 2.666 kPa (20 Torr) to 46.65 kPa (350 Torr). This pressure range makes it possible to promote the reaction between the intermediate products and hydrogen fluoride gas.

The cycle of the post cleaning process alternately comprising the oxidation stage and removal stage in this order, as described above, is repeated a predetermined number of times, such as 10 times. In each cycle, the silicon-containing fluorides are oxidized to form intermediate products, and then the hydrogen fluoride gas is caused to react with the intermediate products and remove them by etching and so forth. Consequently, the silicon-containing fluorides remaining inside the reaction tube 2 are removed more effectively and reliably as compared with the prior art.

When the post cleaning process is finished, the wafer boat 11 is unloaded. Specifically, nitrogen gas is supplied into the reaction tube 2 at a predetermined flow rate, so that the pressure inside the reaction tube 2 is returned to atmospheric pressure. Then, the lid 5 is moved down by the boat elevator 128, and the empty wafer boat 6 is thereby unloaded out of the reaction tube 2. Thereafter, the wafer boat 6 with a new lot of semiconductor wafers W mounted thereon is placed on the lid 5, and the film formation process is started again in the manner described above.

<Experiment 1>

In the film formation apparatus 1 described above, the film formation process and cleaning process were performed, and it was confirmed whether film formation by-products and silicon-containing fluorides deposited inside the reaction tube 2 were removed. Specifically, the film formation process was performed in accordance with FIG. 4 to form a silicon oxide film, so that film formation by-products containing silicon oxide as the main component were deposited to have a thickness of 1 µm on the inner surface of the reaction tube 2. Then, the cleaning process was performed in accordance with FIG. 4 to treat the interior of the reaction tube 2 so as to remove the film formation by-products. Then, the state of the inner surface of the reaction tube 2 thus treated by the cleaning process was examined by use of pictures taken by scanning electron microscope (SEM). As a result, the inner surface of the reaction tube 2 showed no film formation by-products or silicon-containing fluorides remaining thereon.

<Experiment 2>

Further, as a present example PE according to the embodiment described above, the post cleaning process was performed to remove the silicon-containing fluorides as described above, while the time necessary for this process was measured. In addition, as a comparative example CE according to the prior art, the interior of the reaction tube was heated from room temperature to 100° C. to remove the silicon-containing fluorides and was then returned to room temperature, while the time necessary for this operation was measured. Then, the efficiency of the cleaning process according to the embodiment was examined by comparing these measured times of the present example and comparative example.

Figure 5:
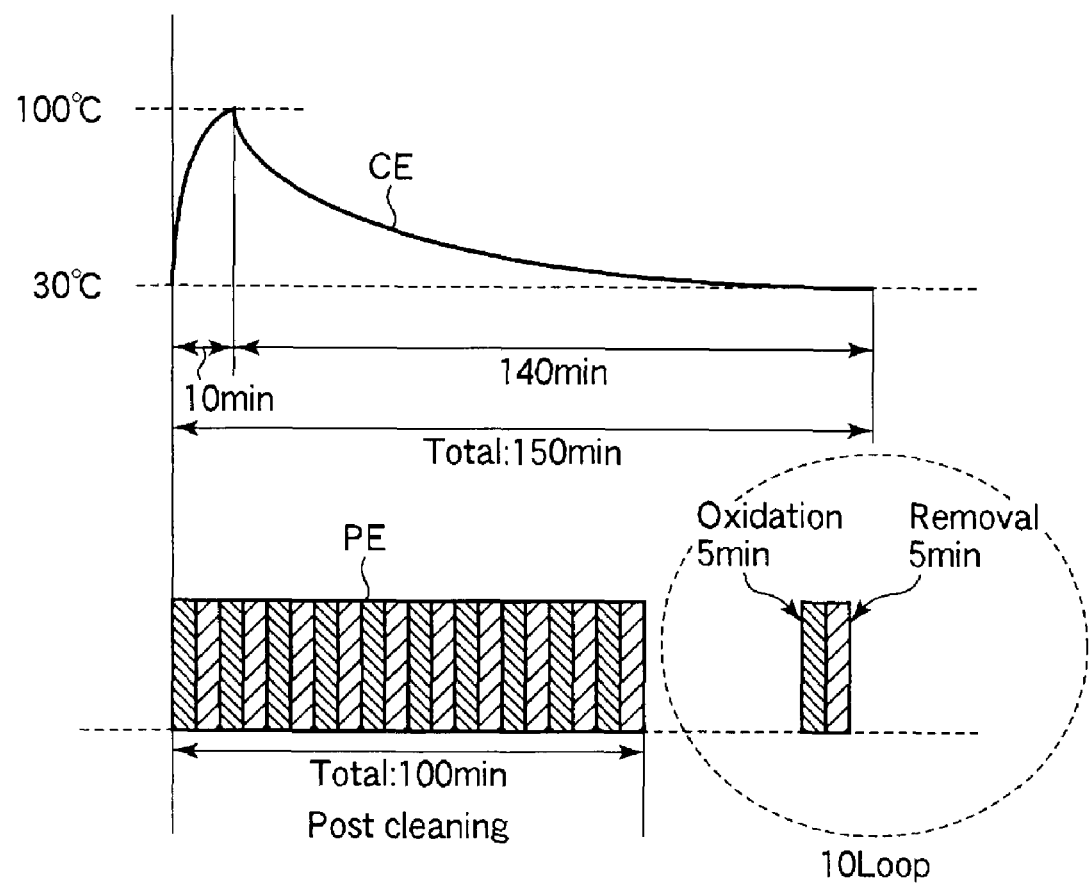
FIG. 5 is a view comparing a present example PE according to the present invention with a comparative example CE in terms of time necessary for removing silicon-containing fluorides.

FIG. 5 is a view comparing the present example PE according to the present invention with the comparative example CE in terms of time necessary for removing silicon-containing fluorides. As shown in FIG. 5, the measured time of the comparative example CE was 150 minutes and the measured time of the present example PE (the post cleaning process) was 100 minutes, which was shorter than the former value by 50 minutes. Accordingly, it has been confirmed that the embodiment described above can effectively perform cleaning of the film formation apparatus.

<Consequence and Modification>

According to the embodiment described above, a cleaning process inside the reaction tube 2 is performed by the main cleaning process and the post cleaning process comprising the oxidation stage and removal stage repeated a plurality of times. Consequently, the cleaning process inside the reaction tube 2 can be performed more effectively and reliably as compared with the prior art.

In the embodiment, the film formation process and cleaning process are performed at room temperature, there is no need for the film formation apparatus 1 to include a heater for heating the inside the reaction tube 2. Further, although the film formation apparatus 1 including no heater is used, the reaction tube 2 does not require a heater to be attached thereon for removing silicon-containing fluorides, and so the cleaning process inside the reaction tube 2 can be effectively performed.

In the embodiment, since DIPAS is used as a silicon source gas, the adsorption rate is not decreased, whereby the productivity is maintained. Further, DIPAS is thermally stable and facilitates its flow rate control such that conventional systems can be used for the source supply, resulting in high versatility.

In the embodiment, the oxidizing gas is exemplified by oxygen gas. In this respect, another gas, such as ozone ($O_3$) or water vapor ($H_2O$), may be used as the oxidizing gas. For example, where ozone is used as the oxidizing gas, process conditions are preferably arranged such that the temperature of the process field 2a is set to be −32° C. to 100° C., the pressure thereof is set at 655 Pa (5 Torr), and the flow rates of oxygen ($O_2$) and ozone are respectively set at 10 slm and about 250 g/Nm$^3$.

In the embodiment, the film formation apparatus 1 includes no heater. Alternatively, a film formation apparatus including a heater or a film formation apparatus including a cooler may be used.

In the embodiment, oxygen radicals are generated by use of plasma. In this respect, another medium, such as catalyst, UV, or magnetic force, may be used to activate the oxidizing gas.

In the embodiment, a silicon oxide film is formed on semiconductor wafers W. Alternatively, the present invention may be applied to a case where another silicon-containing film, such as a silicon nitride film, is formed. In this case, for example, a silicon nitride film is formed on semiconductor wafers W by repeating a plurality of times a cycle comprising an adsorption stage for adsorbing Si by use of DIPAS and a nitridation stage for nitriding the adsorbed Si by use of a nitriding gas. The nitriding gas may be one or more gases selected from the group consisting of ammonia ($NH_3$), nitrogen dioxide ($N_2O$), nitrogen oxide (NO), and nitrogen ($N_2$).

In the embodiment, N2 gas is supplied in the purge step. In this respect, the term "purge" means removal of the residual gas inside the reaction tube 2 by vacuum-exhausting the interior of the reaction tube 2 while supplying an inactive gas, such as $N_2$ gas, into the reaction tube 2, or by vacuum-exhausting the interior of the reaction tube 2 while maintaining the shut-off state of supply of all the gases.

In the embodiment, a cycle comprising the oxidation stage and removal stage is repeated 10 times. In this respect, the number of repetitions of the cycle may be smaller, such as, 5 or 7 times. Alternatively, the number of repetitions of the cycle may be larger, such as, 12 or 14 times. Also in these cases, the cleaning process inside the reaction tube 2 can be effectively performed by adjusting, e.g., the flow rate of hydrogen fluoride gas in accordance with the number of repetitions of the cycle.

In the embodiment described above, nitrogen gas is supplied as a dilution gas when a process gas is supplied. In this respect, no nitrogen gas may be supplied when the process gas is supplied. However, the process gas preferably contains nitrogen gas as a dilution gas, because the process time can be more easily controlled if it is so arranged. The dilution gas consists preferably of an inactive gas, such as nitrogen gas or another inactive gas, e.g., helium (He), neon (Ne), argon (Ar), krypton (Kr), or xenon (Xe) in place of nitrogen gas.

In the embodiment described above, the gas distribution nozzle 8 is disposed to supply a process gas to be excited by plasma, while the gas distribution nozzle 9 is disposed to supply a process gas to be not excited by plasma. Alternatively, gas supply nozzles may be respectively disposed in accordance with the types of gases. Further, a plurality of gas supply nozzles may be connected to the sidewall of the reaction tube 2 near the bottom, to supply each gas through a plurality of nozzles. In this case, a process gas is supplied through a plurality of gas supply nozzles into the reaction tube 2, and thereby more uniformly spreads in the reaction tube 2.

In the embodiment, the film formation apparatus employed is a processing apparatus of the batch type having a single-tube structure. However, for example, the present invention may be applied to a vertical processing apparatus of the batch type having a process container of the double-tube type, which is formed of inner and outer tubes. Alternatively, the present invention may be applied to a horizontal processing apparatus of the batch type or a processing apparatus of the single-substrate type. The target substrate is not limited to a semiconductor wafer W, and it may be a glass substrate for, e.g., an LCD.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for using a film formation apparatus for performing a film formation process to form a thin film containing silicon on a target substrate inside a reaction chamber, the method comprising:
    performing a main cleaning process and a post cleaning process in this order inside the reaction chamber without the target substrate accommodated therein to remove a film formation by-product containing silicon, generated by the film formation process, and deposited inside the reaction chamber,
    wherein the main cleaning process is arranged to supply a cleaning gas containing fluorine into the reaction chamber while exhausting gas from inside the reaction chamber, thereby etching the film formation by-product, and the post cleaning process is arranged to remove a silicon-containing fluoride generated by the main cleaning process and remaining inside the reaction chamber and to alternately repeat, a plurality of times,
    supplying an oxidizing gas into the reaction chamber to transform the silicon-containing fluoride into an intermediate product by oxidization, and
    supplying hydrogen fluoride gas into the reaction chamber while exhausting gas from inside the reaction chamber to remove the intermediate product by a reaction between the hydrogen fluoride gas and the intermediate product.

2. The method according to claim 1, wherein the oxidizing gas is selected from the group consisting of oxygen gas, ozone, and water vapor.

3. The method according to claim 1, wherein said supplying an oxidizing gas comprises supplying the oxidizing gas while activating the oxidizing gas by a plasma generation section attached to the reaction chamber.

4. The method according to claim 1, wherein the main cleaning process and the post cleaning process are arranged to set the reaction chamber at a temperature of from room temperature to 100° C.

5. The method according to claim 3, wherein the post cleaning process is arranged to continuously exhaust gas from inside the reaction chamber during said supplying an oxidizing gas and said supplying hydrogen fluoride gas such that pressure inside the reaction chamber is lower in said supplying an oxidizing gas than in said supplying hydrogen fluoride gas.

6. The method according to claim 5, wherein the pressure inside the reaction chamber is set to be 0.133 Pa (1 mTorr) to 13.3 kPa (100 Torr) in said supplying an oxidizing gas and to be 0.133 Pa (1 mTorr) to 101.3 kPa (760 Torr) in said supplying hydrogen fluoride gas.

7. The method according to claim 1, wherein the method further comprises solely supplying an inactive gas into the reaction chamber while exhausting gas from inside the reaction chamber to purge an interior of the reaction chamber between the main cleaning process and the post cleaning process.

8. The method according to claim 1, wherein the method further comprises performing a film formation process before the main cleaning process, and the film formation process is arranged to supply a silicon source gas and a film formation reaction gas into the reaction chamber to form the thin film by CVD on the target substrate accommodated in the reaction chamber.

9. The method according to claim 8, wherein the film formation process is arranged to supply the silicon source gas and the film formation reaction gas by MLD (molecular layer deposition) to form the thin film.

10. The method according to claim 8, wherein the film formation process comprises supplying the film formation reaction gas while activating the film formation reaction gas by a plasma generation section attached to the reaction chamber.

11. The method according to claim 8, wherein the film formation process is arranged to supply an oxidizing gas as the film formation reaction gas to form a silicon oxide film as the thin film.

12. The method according to claim 11, wherein the silicon source gas is di-iso-propylaminosilane gas, and the film formation reaction gas is selected from the group consisting of oxygen gas, ozone, and water vapor.

13. The method according to claim 1, wherein the reaction chamber is configured to accommodate a plurality of target substrates at intervals in a vertical direction.

14. A method for using a film formation apparatus for performing a film formation process to form a thin film containing silicon,
    the film formation apparatus comprising
        a reaction chamber configured to accommodate a plurality of target substrates at intervals in a vertical direction,
        a support member configured to support the target substrates inside the reaction chamber,
        an exhaust system configured to exhaust gas from inside the reaction chamber,
        a gas supply system configured to supply, into the reaction chamber, a silicon source gas, a film formation reaction gas, and a gas for cleaning an interior of the reaction chamber, and
        a control section configured to control an operation of the apparatus,
    the method being executed under control of the control section and comprising:
        performing a film formation process arranged to supply the silicon source gas and the film formation reaction gas into the reaction chamber to form the thin film by CVD on the target substrates accommodated in the reaction chamber; and
        performing a main cleaning process and a post cleaning process in this order inside the reaction chamber without the target substrates accommodated therein to remove a film formation by-product containing silicon, generated by the film formation process, and deposited inside the reaction chamber, wherein the main cleaning process is arranged to supply a cleaning gas containing fluorine into the reaction chamber while exhausting gas from inside the reaction chamber, thereby etching the film formation by-product, and the post cleaning process is arranged to remove a silicon-containing fluoride generated by the main cleaning process and remaining inside the reaction chamber and to alternately repeat, a plurality of times, supplying an oxidizing gas into the reaction chamber to transform the silicon-containing fluoride into an intermediate product by oxidization, and supplying hydrogen fluoride gas into the reaction chamber while exhausting gas from inside the reaction chamber to remove the intermediate product by a reaction between the hydrogen fluoride gas and the intermediate product.

15. The method according to claim 14, wherein the film formation apparatus further comprises a plasma generation section attached to the reaction chamber and configured to activate gas, the film formation process comprises supplying the film formation reaction gas while activating the film formation reaction gas by the plasma generation section, and said supplying an oxidizing gas comprises supplying the oxidizing gas while activating the oxidizing gas by the plasma generation section.

16. The method according to claim 14, wherein the film formation process is arranged to supply an oxidizing gas as the film formation reaction gas to form a silicon oxide film as the thin film.

17. The method according to claim 15, wherein the film formation process, the main cleaning process, and the post cleaning process are arranged to set the reaction chamber at a temperature of from room temperature to 100° C.

18. The method according to claim 14, wherein the silicon source gas is di-iso-propylaminosilane gas, and the film formation reaction gas is selected from the group consisting of oxygen gas, ozone, and water vapor.

19. A film formation apparatus for performing a film formation process to form a thin film containing silicon, the apparatus comprising:

a reaction chamber configured to accommodate a plurality of target substrates at intervals in a vertical direction;

a support member configured to support the target substrates inside the reaction chamber;

an exhaust system configured to exhaust gas from inside the reaction chamber;

a gas supply system configured to supply, into the reaction chamber, a silicon source gas, a film formation reaction gas, and a gas for cleaning an interior of the reaction chamber; and a control section configured to control an operation of the apparatus and preset to execute a method that comprises performing a film formation process arranged to supply the silicon source gas and the film formation reaction gas into the reaction chamber to form the thin film by CVD on the target substrates accommodated in the reaction chamber, and performing a main cleaning process and a post cleaning process in this order inside the reaction chamber without the target substrates accommodated therein to remove a film formation by-product containing silicon, generated by the film formation process, and deposited inside the reaction chamber, wherein the main cleaning process is arranged to supply a cleaning gas containing fluorine into the reaction chamber while exhausting gas from inside the reaction chamber, thereby etching the film formation by-product, and the post cleaning process is arranged to remove a silicon-containing fluoride generated by the main cleaning process and remaining inside the reaction chamber and to alternately repeat, a plurality of times, supplying an oxidizing gas into the reaction chamber to transform the silicon-containing fluoride into an intermediate product by oxidization, and supplying hydrogen fluoride gas into the reaction chamber while exhausting gas from inside the reaction chamber to remove the intermediate product by a reaction between the hydrogen fluoride gas and the intermediate product.

20. A non-transitory computer readable medium containing program instructions for execution on a processor, wherein the program instructions, when executed by the processor, control a film formation apparatus to conduct the method according to claim 1.

* * * * *